(12) United States Patent
Gingrich, III

(10) Patent No.: US 7,952,114 B2
(45) Date of Patent: May 31, 2011

(54) LED INTERCONNECT ASSEMBLY

(75) Inventor: Charles Raymond Gingrich, III, Mechanicsburg, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 283 days.

(21) Appl. No.: 12/235,822

(22) Filed: Sep. 23, 2008

(65) Prior Publication Data

US 2010/0072505 A1 Mar. 25, 2010

(51) Int. Cl.
H01L 33/00 (2010.01)
(52) U.S. Cl. .................... 257/99; 257/E33.058
(58) Field of Classification Search .............. 257/99, 257/E33.058, E33.075
See application file for complete search history.

(56) References Cited

U.S. PATENT DOCUMENTS

| | | | |
|---|---|---|---|
| 6,386,733 B1 | 5/2002 | Ohkohdo et al. | |
| 6,517,218 B2 | 2/2003 | Hochstein | |
| 6,821,625 B2 | 11/2004 | Chu et al. | |
| 6,826,336 B2 * | 11/2004 | Guy | 385/49 |
| 6,897,486 B2 | 5/2005 | Loh | |
| 6,999,318 B2 | 2/2006 | Newby | |
| 7,078,254 B2 | 7/2006 | Loh | |
| 7,138,667 B2 | 11/2006 | Barnett et al. | |
| 7,161,190 B2 | 1/2007 | Chikugawa | |
| 7,236,366 B2 | 6/2007 | Chen | |
| 7,261,452 B2 | 8/2007 | Coushaine et al. | |
| 7,276,739 B2 | 10/2007 | Chen et al. | |
| 7,285,802 B2 | 10/2007 | Ouderkirk et al. | |
| 7,296,916 B2 | 11/2007 | Ouderkirk et al. | |
| 7,300,175 B2 | 11/2007 | Brukilacchio | |
| 7,303,301 B2 | 12/2007 | Koren et al. | |
| 7,622,795 B2 * | 11/2009 | Chiang | 257/675 |
| 7,762,829 B2 * | 7/2010 | Daily et al. | 439/345 |
| 2001/0024368 A1 | 9/2001 | Henrici et al. | |
| 2005/0078453 A1 | 4/2005 | Chu et al. | |
| 2005/0239342 A1 | 10/2005 | Moriyama et al. | |
| 2007/0070645 A1 | 3/2007 | Coushaine et al. | |
| 2008/0087911 A1 | 4/2008 | Stoyan | |
| 2008/0224166 A1 * | 9/2008 | Glovatsky et al. | 257/99 |

FOREIGN PATENT DOCUMENTS

| | | |
|---|---|---|
| DE | 20 2008 001 026 U1 | 4/2008 |
| EP | 1 758 179 | 2/2007 |
| WO | WO 02/12788 | 2/2002 |

OTHER PUBLICATIONS

International Search Report, International Application No. PCT/US2009/005238, International Filing Date Sep. 21, 2009.

* cited by examiner

Primary Examiner — Benjamin P Sandvik

(57) ABSTRACT

A light-emitting device assembly which can be used in many applications has a contact carrier, at least one light-emitting device, a heat sink and at least one securing member. The contact carrier has a light-emitting device receiving region and resilient contacts which are provided proximate to the light-emitting device receiving region. The at least one light-emitting device has leads which extend therefrom to mechanically and electrically engage the resilient contacts. The heat sink is thermally coupled to the at least one light-emitting device. The at least one securing member extends through the contact carrier and into the heat sink to releasably retain the contact carrier and the at least one light-emitting device in position relative to each other and relative to the heat sink.

19 Claims, 11 Drawing Sheets

LED INTERCONNECT ASSEMBLY

FIELD OF THE INVENTION

The present invention is directed to an LED connector assembly, and more particularly to an assembly in which the LED is electrically and thermally connected without the use of solder and/or thermal adhesives.

BACKGROUND OF THE INVENTION

Illumination assemblies are used in a variety of diverse applications. Traditional illumination assemblies have used lighting sources such as incandescent or fluorescent lights, for example. More recently, other types of light-emitting elements, and light-emitting diodes (LEDs) in particular, have been used in illumination assemblies. LEDs have the advantages of small size, long life, and low power consumption. These advantages of LEDs make them useful in many diverse applications.

For many lighting applications, it is desirable to have one or more LEDs supply the required light intensity and/or distribution. For example, several LEDs can be assembled in an array having small dimensions to provide a high illuminance in a small area, or the LEDs can be distributed over a larger area to provide a broader and more uniform illuminance.

LEDs in an array are commonly connected to each other and to other electrical systems by mounting the LEDs onto a printed circuit board substrate. LEDs may be populated onto a substrate using techniques that are common to other areas of electronics manufacturing, e.g., locating components onto circuit board traces, followed by bonding the components to the substrate using one of a number of known technologies, including wave soldering, reflow soldering, and attachment using conductive adhesives.

LEDs simultaneously produce both light and heat and will rapidly accumulate heat around their mounting surface. The heat produced by the LEDs should be quickly removed from the LED apparatus to keep the temperature of the entire LED apparatus from rapidly becoming high. If the heat produced by the LEDs cannot be efficiently dissipated, the accumulated heat may cause unexpected damage to or influence normal operations of other parts adjacent to the LED apparatus.

U.S. Pat. No. 7,296,916 discloses an example of an assembly for use with an LED. The illumination assembly includes a thermally conductive substrate, a reflective layer proximate a first major surface of the thermally conductive substrate, a patterned conductive layer positioned between the reflective layer and the first major surface of the thermally conductive substrate and electrically isolated from the thermally conductive substrate, and at least one LED including a post that is attached to the thermally conductive substrate. The at least one LED can be thermally connected to the thermally conductive substrate through the post and electrically connected to the patterned conductive layer.

While these types of assemblies provide adequate electrical and thermal connection, they can be difficult to assemble and costly to produce. It would, therefore, be beneficial to provide an LED assembly which does not require components to be soldered or attached using conductive adhesive. It would also be beneficial to provide an assembly which does not require the use of a printed circuit board or expensive circuitry to make the required electrical connection.

SUMMARY OF THE INVENTION

The disclosure is directed to an assembly for housing a light-emitting device which can be used in many applications. The assembly has a contact carrier, at least one light-emitting device, a heat sink and at least one securing member. The contact carrier has a light-emitting device receiving region and resilient contacts which are provided proximate to the light-emitting device receiving region. The at least one light-emitting device has leads which extend therefrom to mechanically and electrically engage the resilient contacts. The heat sink is thermally coupled to the at least one light-emitting device to draw heat away from the at least one light-emitting device to maintain the at least one light-emitting device at a proper operating temperature. The at least one securing member extends through the contact carrier and into the heat sink to releasably retain the contact carrier and the at least one light-emitting device in position relative to each other and relative to the heat sink.

The contact carrier may be a cover which is positioned over the at least one light-emitting device. The cover may have mounting openings through which that at least one securing member may extend.

Alternately, the contact carrier is a substrate which is positioned between the at least one light-emitting device and the heat sink. The substrate may have a heat sink receiving opening through which a portion of the heat sink extends to thermally engage the at least one light-emitting device. In this embodiment, a cover extends over the substrate and the at least one light-emitting device. The at least one securing member may be a plurality of latching legs which extend from the cover and which cooperate with openings in the heat sink to resiliently latch the cover to the heat sink, causing the at least one light-emitting device and the resilient contacts to be maintained in electrical engagement and the at least one light-emitting device and the heat sink to be maintained in thermal engagement.

The cover may have at least one opening which aligns with the at least one light-emitting device. The at least one opening has slits provided in sidewalls thereof; the slits separate portions of the sidewalls, allowing the portions of the sidewalls to have independent resiliency. As the cover is latched to the heat sink, the portions of the sidewalls will resiliently cooperate with the at least one light-emitting device to maintain the at least one light-emitting device in position.

Thermally conductive material may be provided between the portion of the heat sink which extends in the heat sink receiving opening and the at least one light-emitting device. The thermally conductive material can facilitate the conduction of heat away from the at least one light-emitting device.

The contact carrier may be a molded interconnect device. The light-emitting device may be a light-emitting diode.

Other features and advantages of the present invention will be apparent from the following more detailed description of the preferred embodiment, taken in conjunction with the accompanying drawings which illustrate, by way of example, the principles of the invention.

DETAILED DESCRIPTION OF THE INVENTION

Figure 1:
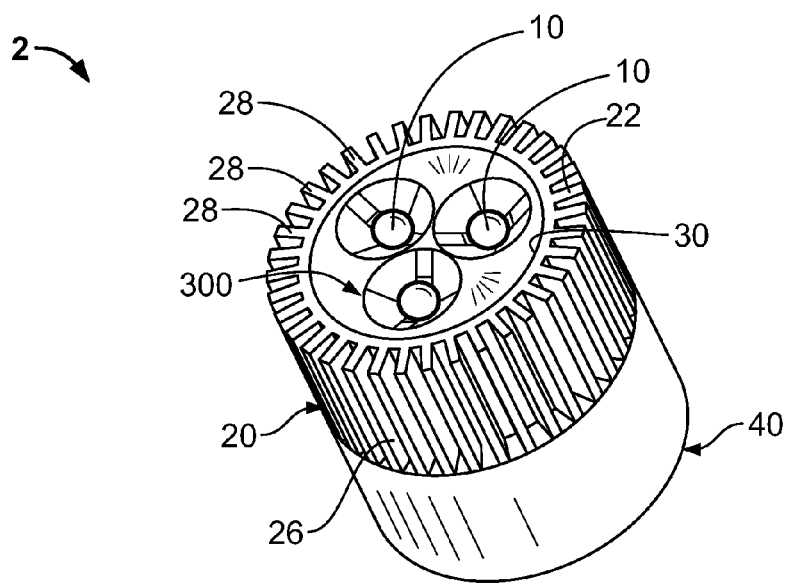
FIG. 1 is a perspective view of an embodiment of an LED socket assembly.

Referring to FIG. 1, a light-emitting device interconnect assembly 2 is shown. In the embodiment of FIG. 1, three Cree MC-E LEDs (light-emitting diodes) 10 are shown. The luminous flux of the three Cree MC-E LEDs in warm white is roughly equivalent to that of a 50 watt MR 16 halogen bulb or a 60 watt incandescent bulb. However, the invention is not limited to the use of three LEDs or to the particular LEDs shown or to the output described. Any number of light-emitting devices or LEDs 10 can be used without departing from the scope of the invention.

Figure 13:
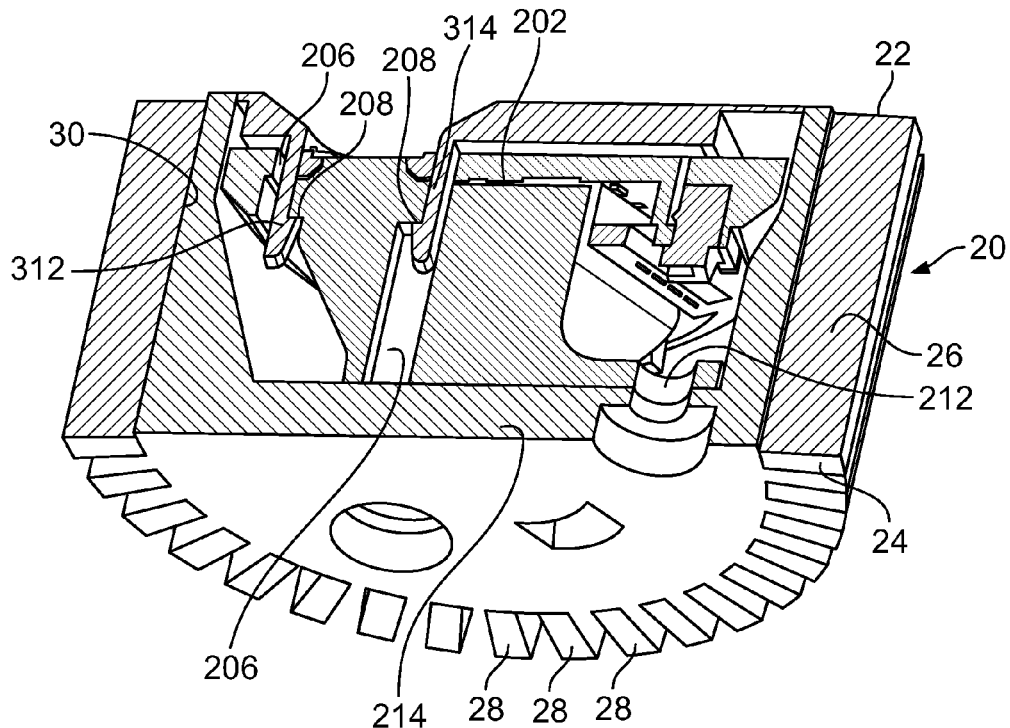
FIG. 13 is a perspective cross-sectional view of the cover and heat spreader of FIG. 12 positioned in the opening of the top member.

The assembly 2 has a finned heat sink or top portion 20 and a bottom portion 40. The top portion 20, as shown in FIGS. 1 and 13, has a top surface 22, a bottom surface 24 and a sidewall 26 which extends therebetween. The sidewall 26 has heat transfer fins 28 provided thereon. A component receiving cavity or opening 30 extends from the top surface 22 to the bottom surface 24. The top portion 20 may be made from aluminum, copper, graphite, metal-filled polymeric compositions, or other such materials with suitably high heat transfer coefficients, as will be more fully discussed below.

The bottom portion 40 is an LED cooler which provides fan-less air moving to provide active cooling to the LEDs and other components which are housed in the opening 30 of the top portion 20. An example of this type of cooler is the SynJet™ MR16 LED Cooler manufactured by Nuventix, Inc.

Figure 2:
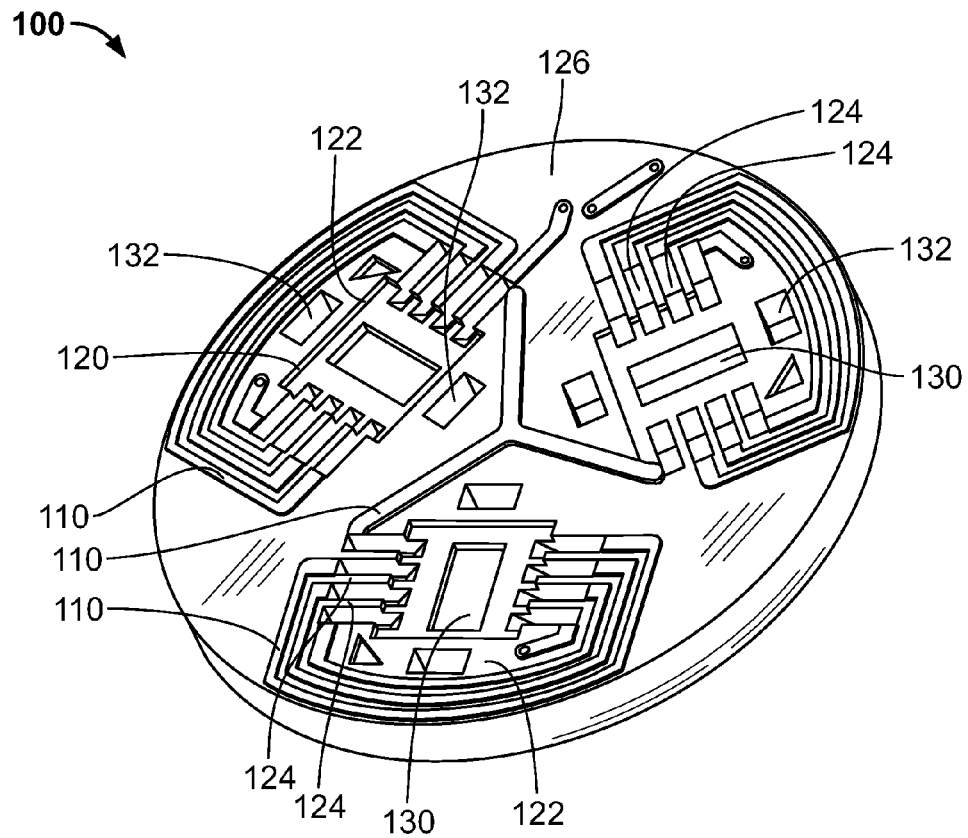
FIG. 2 is a top perspective view of a chip carrier substrate for use in the LED socket assembly of FIG. 1.
Figure 3:
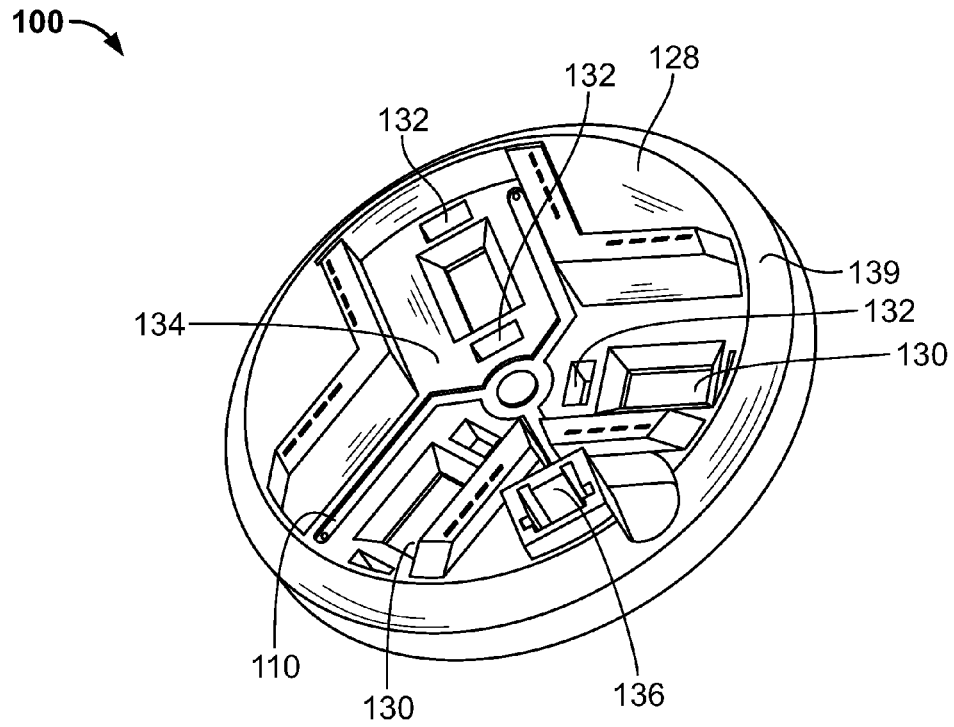
FIG. 3 is a bottom perspective view of the chip carrier substrate of FIG. 2.
Figure 5:
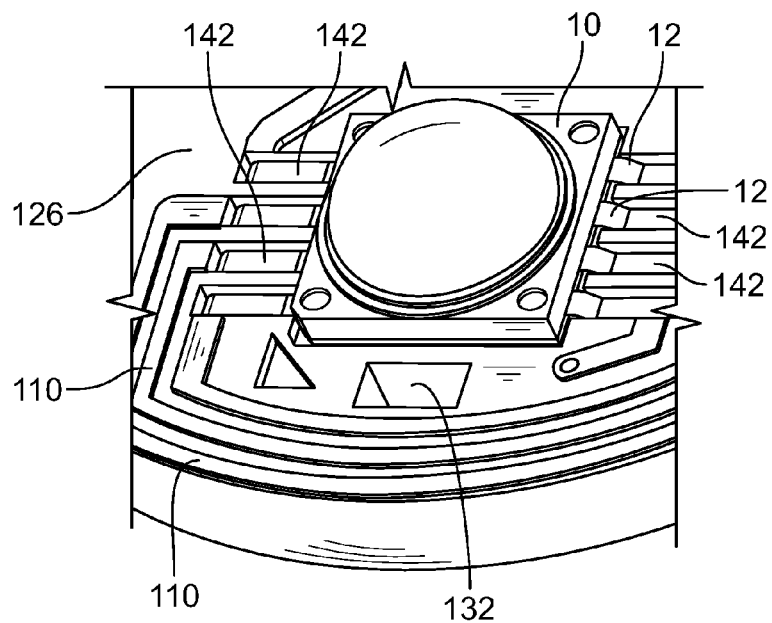
FIG. 5 is an enlarged perspective of an LED seating recess similar to that of FIG. 4 with an LED seated therein.
Figure 6:
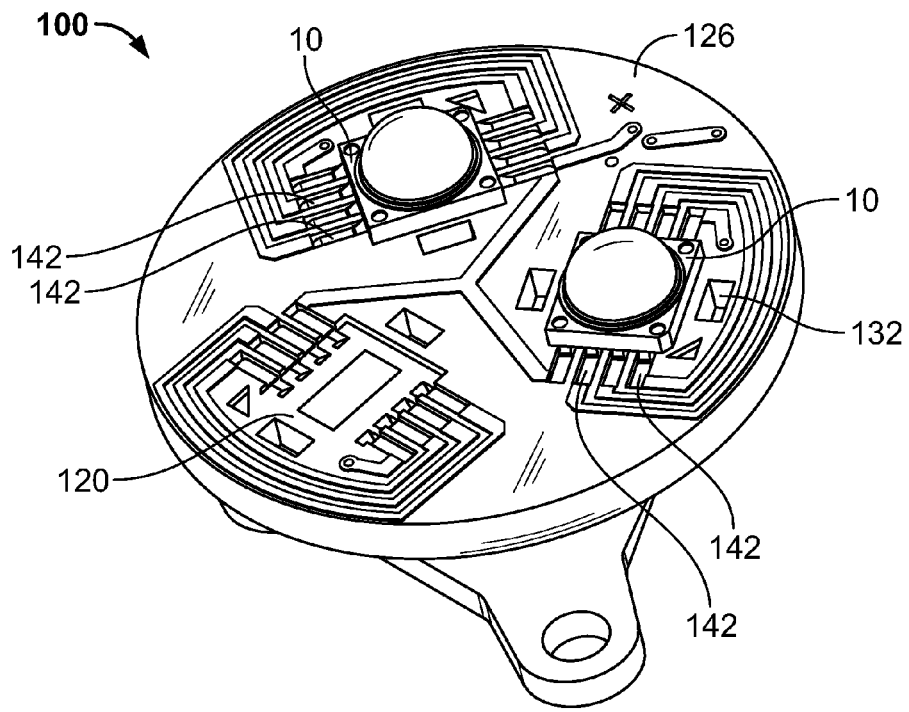
FIG. 6 is a top perspective view of the chip carrier substrate positioned on a heat spreader, the chip carrier substrate having two LEDs seated in respective LED seating recesses.

Referring to FIGS. 2 and 3, a contact carrier or substrate 100 with circuitry and circuit paths 110 molded therein is provided to cooperate with the LEDs 10 thereto (as shown in FIGS. 5 and 6). The substrate 100 is a molded interconnect device. As is known in the art, molded interconnect devices can implement three-dimensional circuitry while being mechanically self-supporting. Although the substrate shown in the preferred embodiment is a molded interconnect device, other known substrates (i.e., printing circuit boards) can be used. In addition, while the substrate 100 shown has a disc configuration, other configurations of the substrate are possible. The configuration of the substrate 100 generally has some relation to the shape of upper portion 20.

Figure 4:
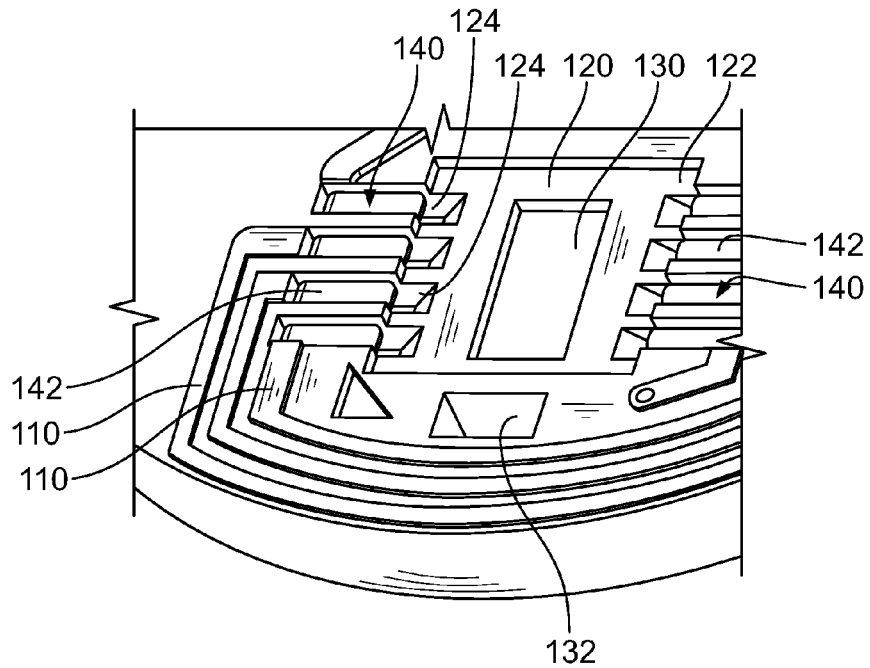
FIG. 4 is an enlarged perspective of an LED seating recess of the chip carrier substrate of FIG. 2.

Substrate 100 has LED receiving regions 120. In the embodiment shown, three LED receiving regions 120 are provided, one LED receiving region 120 for each LED 10. The LED receiving regions 120 have seating recesses 122 which are dimensioned to seat the base of a respective LED 10 therein. Contact receiving openings 124 extend from a first surface 126 of the substrate 100 to a second surface 128. The contact receiving openings 124 are plated through holes which are more narrow proximate the second surface 128. As is best shown in FIG. 4, portions of the contact receiving openings 124 extend into the seating recesses 122. Thermal projection receiving openings 130 are positioned in the seating recesses 122 and extend from the first surface 126 toward the second surface 128. Cover mounting openings 132 are provided on either side of each thermal projection receiving opening 130. Many variations in the number and positioning of the cover mounting openings 132 are possible.

Figure 14:
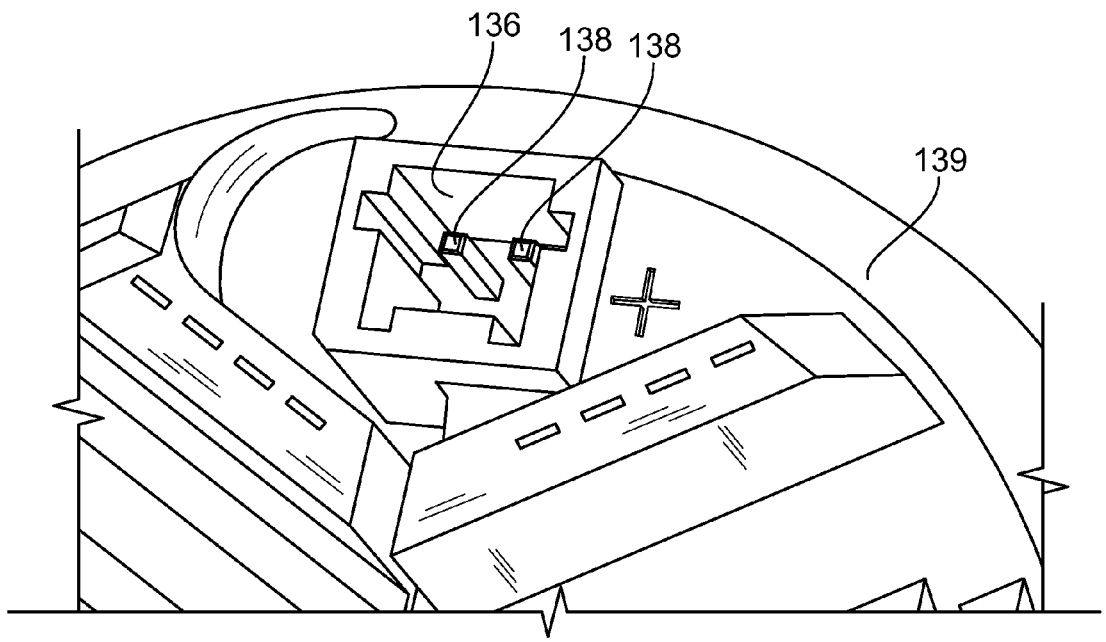
FIG. 14 is an enlarged perspective view of a connector receiving recess on the chip carrier substrate.

Referring more specifically to FIG. 3, a heat spreader receiving cavity 134 extends from second surface 128 toward first surface 126. The thermal projection receiving openings 130 and the cover mounting openings 132 extend into the heat spreader receiving cavity 134. A connector receiving recess 136 is provided in the second surface 128. The connector receiving recess 136 can be configured to allow various connectors to be received therein. As best shown in FIG. 14, contact terminals 138 extend therein. The contact terminals 138 can be plastic pins which have been plated or can be conventional stamped and formed contacts which can be stitched or mounted in any known manner. The contact terminals 138 are provided in electrical contact with the circuit path 110. The connector receiving recess 136 and contact terminals 138 are the interface between the circuitry of the substrate 100 and a mating connector (not shown) which delivers the electrical drive current signals to the assembly 2. The configuration of the connector receiving recess 136 and contact terminals 138 can be made to accommodate the particular mating connector to be mated thereto.

The second surface 128 has a chamfered edge 139 about its periphery. The chamfered edge 139 acts as a lead-in surface when the substrate 100 is inserted into the opening 30 of the top portion 20.

Figure 7:
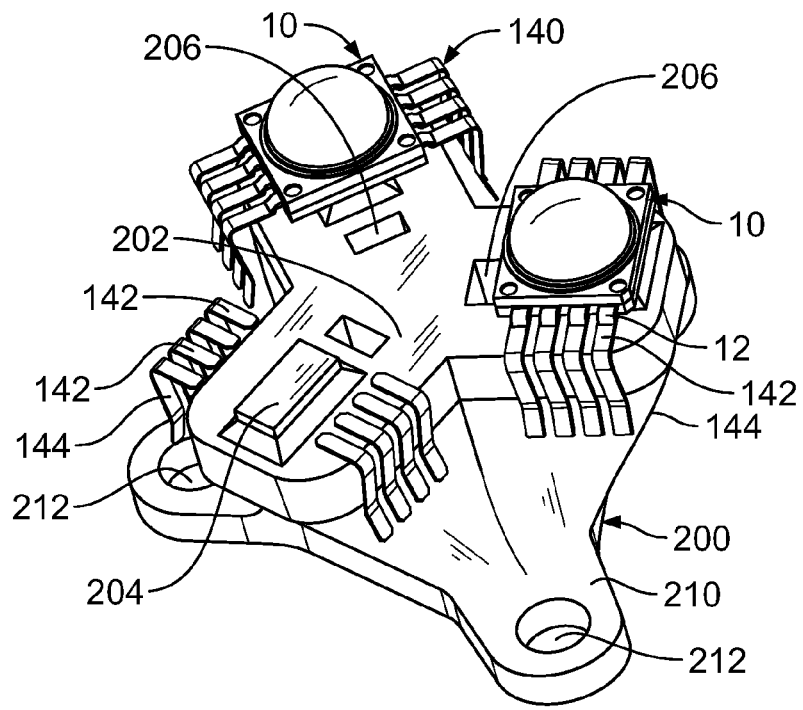
FIG. 7 is a top perspective view similar to that of FIG. 6 with the chip carrier substrate removed.

FIG. 4 shows an enlarged view of one LED receiving region 120. However, as all of the LED receiving regions are essentially identical in the embodiment shown, the description of this one LED receiving region 120 is applicable to all of the LED receiving regions 120. Contacts 140 are positioned in contact receiving openings 124. As best shown in FIG. 7, contacts 140 have a generally L-configuration with a top section 142 and a bottom section 144. The top section 142, as shown in FIGS. 4 through 7, is positioned proximate the first surface 126. The contacts 140 are made from a copper alloy or any material having the appropriate electrical and resilient characteristics required. The bottom sections 144 extend into the narrow portions of the contact receiving openings 124 and frictionally engage the sides of the narrow portions of the plated contact receiving openings 124, thereby mounting the contacts 140, both mechanically and electrically, to the substrate 100. Consequently, as the LED 10 is brought into engagement with the substrate, leads 12 of the LED 10 will engage the top sections 142 of contacts 140. The resiliency of the top sections 142 will allow for the top sections 142 to compensate for minor variations of the leads 12.

Figure 8:
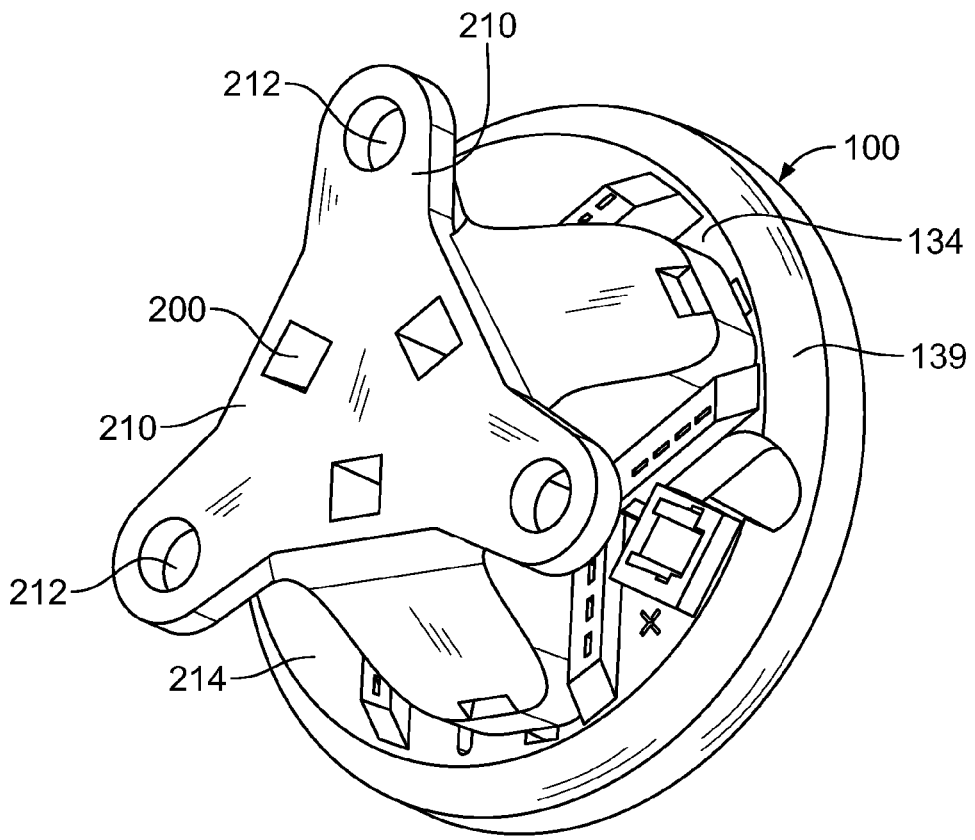
FIG. 8 is a bottom perspective view of the chip carrier substrate positioned on a heat spreader.
Figure 9:
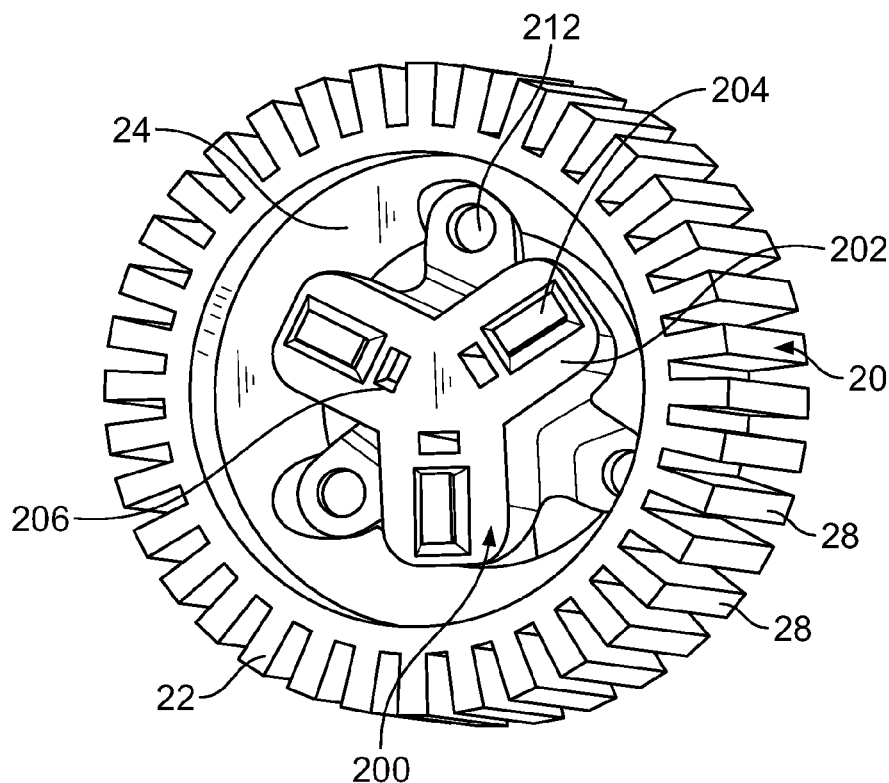
FIG. 9 is a perspective view of the heat spreader positioned in an opening of a top portion of the LED socket assembly.
Figure 12:
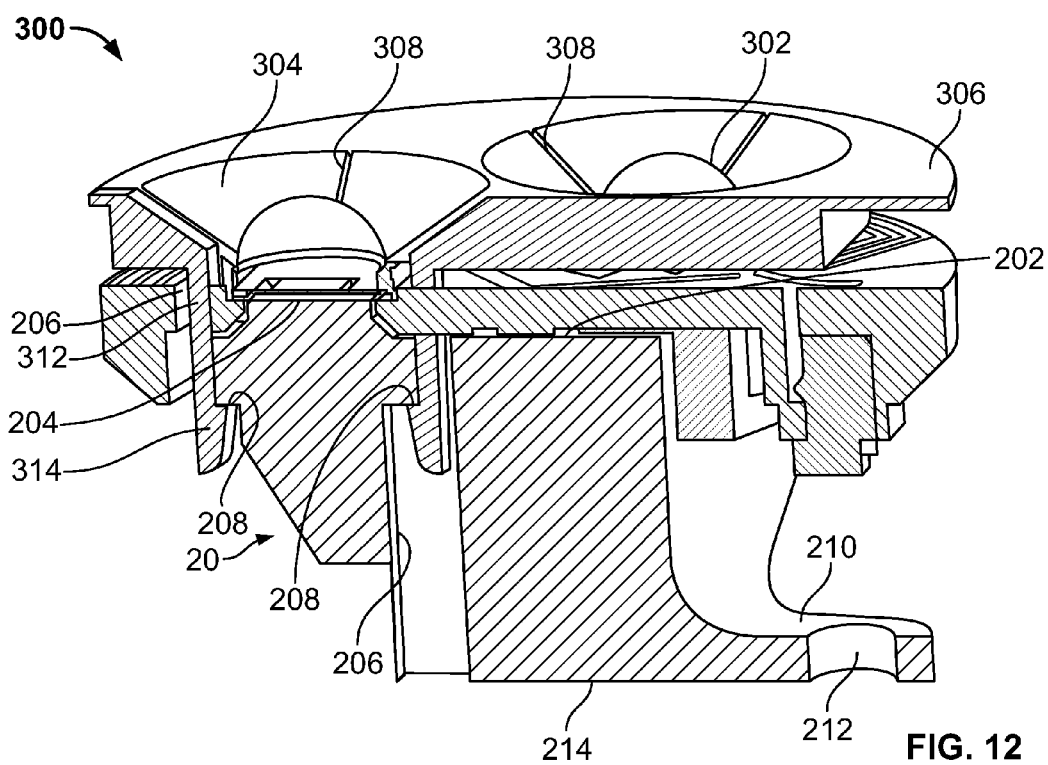
FIG. 12 is a perspective cross-sectional view of the cover attached to the heat spreader.

Referring to FIGS. 7 through 9 and 12, a heat sink or heat spreader 200 is shown. The heat spreader 200 has a top surface 202 with thermal projections 204 extending therefrom. In the embodiment shown, the thermal projections 204 have a rectangular configuration which is essentially the same configuration as the thermal projection receiving openings 130. The particular configuration of the thermal projections and thermal projection receiving openings can vary. Cover mounting openings 206 are provided on either side of each thermal projection 204 and extend through the top surface 202. As best shown in FIG. 12, the mounting openings 206 have latching shoulders 208 provided therein. Referring back to FIGS. 6 through 9, mounting legs 210 with mounting openings 212 extend proximate a bottom surface 214 of the heat spreader 200. The mounting legs 210 and mounting openings 212 facilitate the mounting of the heat spreader 200 in the opening 30 of the top portion 20, as is illustrated in FIG. 9.

Figure 10:
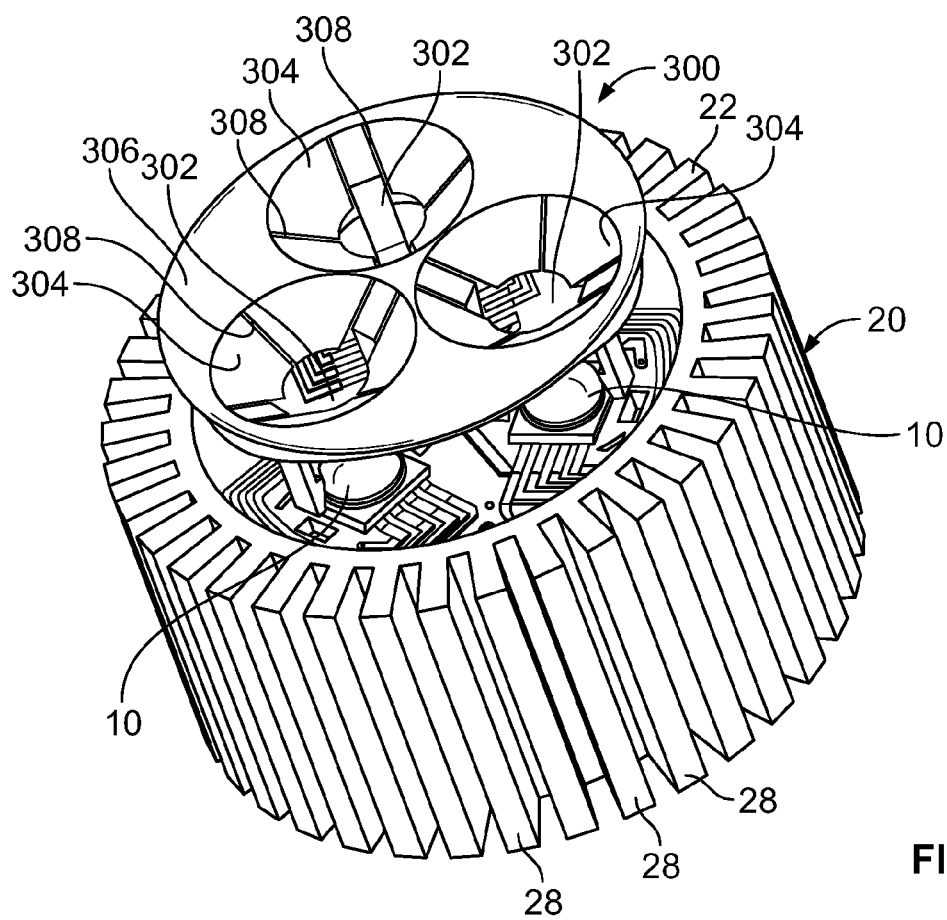
FIG. 10 is a partial perspective view of the LED socket assembly prior to the insertion of a cover thereon.
Figure 11:
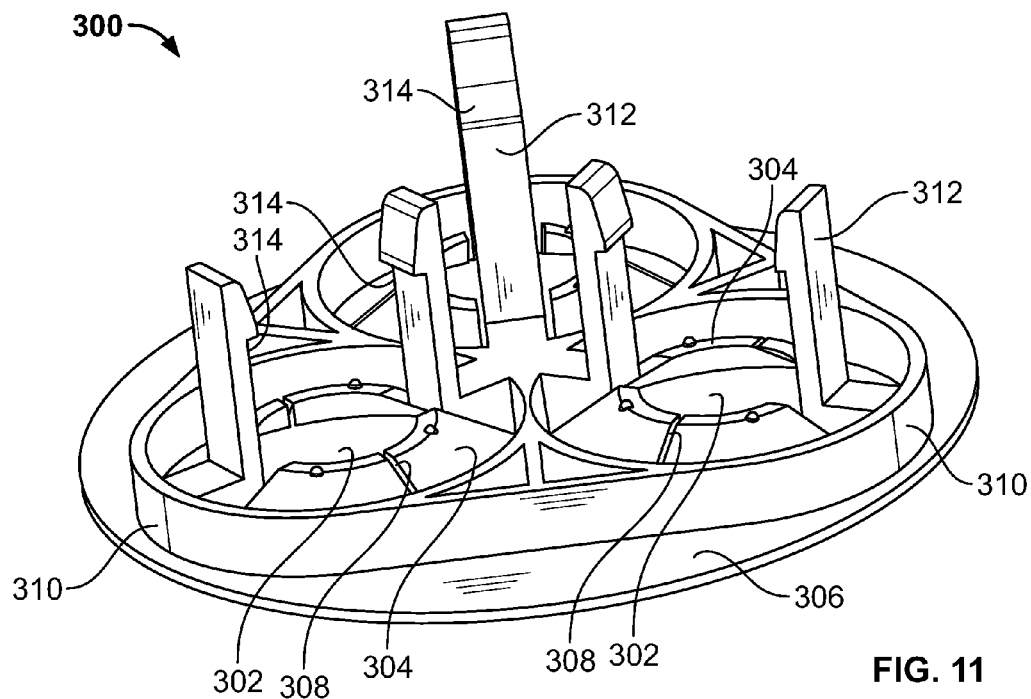
FIG. 11 is a perspective view of the cover of the LED socket assembly.

As best shown in FIGS. 10 through 12, a cover 300 has three openings 302 which align with LEDs 10. The circumferential extending cone-shaped sidewall 304 of the openings 302 extends from a cover plate 306 of the cover 300. The openings 302 have a larger diameter proximate the cover plate 306 and a smaller diameter at a distance spaced from the cover plate 306, causing the sidewall 304 to taper inward. Slits 308 are provided in the sidewall 304 to allow portions of the sidewall 304 to have independent resilient characteristics. Referring to FIG. 11, strengthening ribs 310 are provided proximate the openings 302. The ribs 310 extend from the cover plate 306 and provide strength and stability to the cover. Other embodiments may be provided in which the cover plate has a thicker cross-section, thereby eliminating the need for strengthening ribs 310. Securing members or latching legs 312 extend from ribs 310 in a direction away from cover plate 106. The latching legs 312 have latching shoulders 314 providing proximate free ends thereof. The cover is made from any material that will maintain the resilient characteristics over a wide range of temperatures. Such materials include, but are not limited to, thermoplastics, including thermally conductive, electrically insulating thermoplastics.

In order to form the assembly 2, the top portion 20 and bottom portion 40 are brought together. The heat spreader 200 is then mounted in the opening 30 of the top portion 20. Bolts (not shown) are inserted through the mounting openings 212 of mounting legs 210 and into openings (not shown) in bottom portion 40. The top portion 20 is also mounted to the bottom portion 40 with the same bolts. The heat spreader 200 may be mounted in any number of other ways known in the industry. In order to better facilitate the transfer of heat, a thermal interface material (not shown) may be provided between the heat spreader 200, the top portion 20 and the bottom portion 40.

With the heat spreader 200 properly mounted, the substrate 100 is moved into engagement with the heat spreader 200. The position of the substrate 100 relative to the heat spreader 200 is best illustrated in FIG. 6. In this position, the thermal projections 204 are positioned in the thermal receiving openings 132. Also, as shown in FIG. 8, the heat spreader 200 is positioned in the heat spreader cavity 134. This insures that the substrate 100 is properly aligned with the heat spreader 200 and also provides support to the substrate 100. As the substrate 100 is moved into position, the mating connector (not shown) is inserted into the connector receiving recess 136 and electrically mated thereto.

With substrate 100 supported by heat spreader 200, a thermal grease (not shown) may be applied to the thermal projections 204. Alternately, a compliant thermal pad may be applied, or any other substance may be used which has the appropriate heat transfer characteristics and which eliminates voids between the thermal projections 204 and the bottoms of the LEDs 10 (as will be more fully described below).

The LEDs 10 are next positioned in the seating recesses 122. The use of the seating recesses 122 provides a positive indicator that the LEDs 10 are positioned properly. With the LEDs 10 properly seated, the leads 12 of the LEDs 10 engage the top sections 142 of contacts 140. As the top sections 142 have resilient, spring characteristics, the top sections 142 can compensate for minor variations of the leads 12 and for any warpage or distortion of the LEDs 10 which causes the leads 12 to extend at slightly different heights.

With the LEDs 10 positioned in the seating recesses 122, the bottom surfaces of the LEDs engage the thermal grease, allowing the thermal grease to fill in any voids or irregularities in the bottom surfaces of the LEDs 10. In addition, the positioning of the LEDs 10 causes the grease to flow and fill any voids on the surfaces of the thermal projections 204. The use of the thermal grease enhances the thermal coupling between the LEDs 10 and the thermal projections 204 to allow the thermal projections 204 to draw heat away from the LEDs 10 and the substrate 100.

In applications in which thermal grease is used, the thermal grease can provide a minimal temporary adhesion of the LEDs 10 to the thermal projections 204. This can help maintain the LEDs 10 in the seating recesses 122 until the cover 300 is inserted to more rigidly maintain the LEDs 10 in the seating recesses 122.

Referring to FIGS. 10 through 13, the cover 300 is next moved into the opening 30 of the upper portion 20. As this occurs, the latching legs 312 are aligned with and move into the cover mounting openings 132 of the substrate 100. As insertion continues, the latching shoulders 314 of latching legs 312 pass through the cover mounting openings 132 of the substrate 100 and move into the cover mounting openings 206 of the heat spreader 200. As this occurs, the latching shoulders 314 and latching legs 312 are resiliently moved to the side by the walls of the cover mounting openings 206. As best shown in FIGS. 12 and 13, insertion continues until the latching shoulders 314 are moved beyond the latching shoulders 208 of the cover mounting openings 206. As this occurs, the latching legs 312 are allowed to resiliently return to their unstressed position, causing the latching shoulders 314 to cooperate with the latching shoulders 208 to maintain the cover 300 in the opening 30.

The dimensioning of the latching legs 312 is such that as the latching shoulders 314 and latching shoulders 208 are engaged, the strengthening ribs 310 engage the first surface 126 of the substrate 100. This causes substrate 100 to be forced toward the second portion 40 of the assembly 2, causing the heat spreader cavity 134 to more fully encompass the heat spreader 200 and providing greater stability to the substrate 100. In addition, sidewalls 304 of openings 302 of cover 300 engage the LEDs 10. This causes the LEDs 10 to be forced toward the second portion 40 of the assembly 2, causing the leads 12 to better engage contacts 140 and the bottom surface of the LEDs 10 to better compress the thermal grease, thereby providing a stable and effective electrical and thermal connection.

Due to manufacturing tolerances, it is difficult to precisely control the dimensions of the various molded parts. Therefore, allowing the sidewall 306 to have independent resilient portions, by separating the sidewall by slits 308, allows the sidewalls 306 to exert an appropriate force on the LEDs 10 even if the various dimensions of the parts vary within tolerances. In a similar manner, the resiliency of the top sections 142 of contacts 140 allows an appropriate force to be exerted on the leads 12 of the LEDs 10 even if the various dimensions of the parts vary within tolerances.

With the components properly assembled, the heat generated by the LEDs 10 will be thermally conducted from the LEDs to the heat spreader 200. The heat transfer fins 28 provide additional heat dissipation, allowing the heat captured in the opening 30 of the top portion 20 to be transferred and dissipated by the air surrounding the assembly. Additionally, the bottom portion 40 blows air over the top portion 20 to help dissipate the heat.

Figure 15:
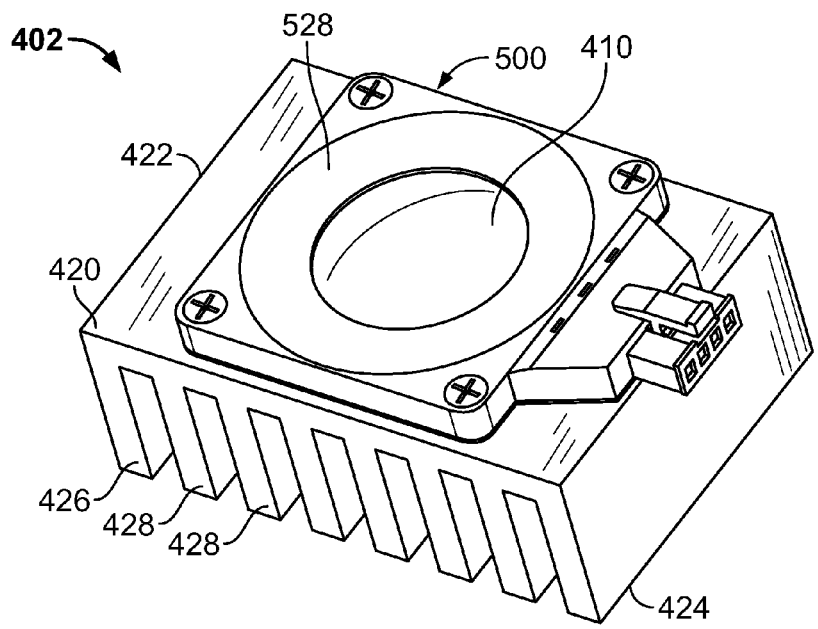
FIG. 15 is a perspective view of a second embodiment of an LED socket assembly.
Figure 16:
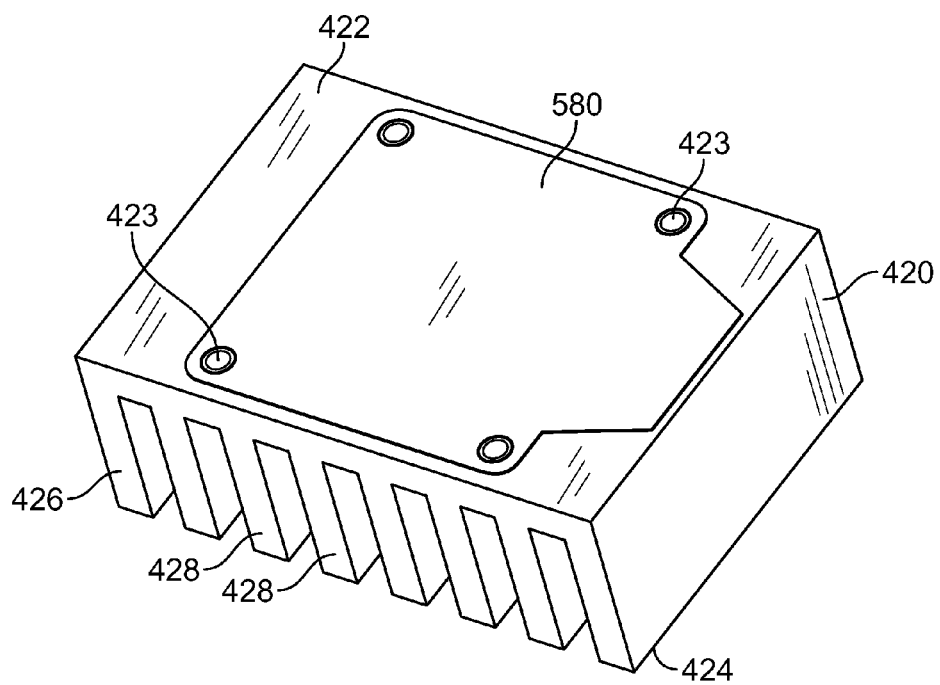
FIG. 16 is a perspective view of a heat sink of the LED socket assembly of FIG. 15 with a conductive thermal pad provided thereon.
Figure 17:
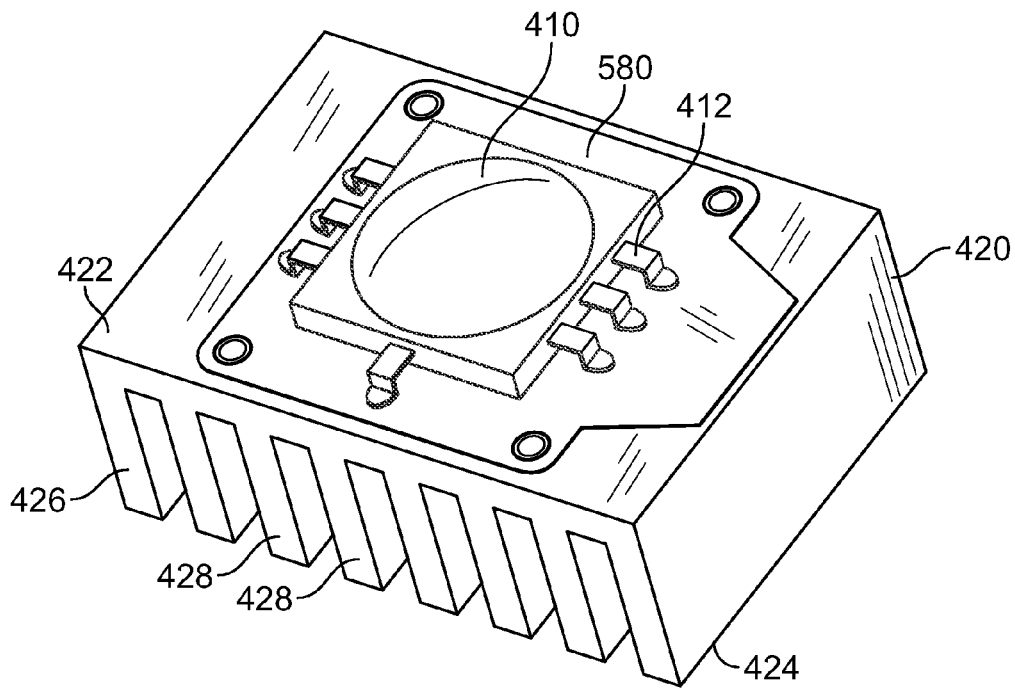
FIG. 17 is a perspective view similar to FIG. 16, with an LED positioned on the conductive thermal pad.

Referring to FIG. 15, an alternate LED interconnect assembly 402 is shown. In the embodiment of FIG. 15, an OPTEK Optimal X LED 410 is shown. However, the invention is not limited to the use of the particular LED shown. In addition, any number of LEDs 410 can be used without departing from the scope of the invention.

The assembly 402 has a heat sink or base portion 420. The base portion 420, as shown in FIGS. 15 through 18, has a top surface 422, a bottom surface 424, and sidewalls 426 which extend therebetween. Mounting openings 423 extend through the top surface. The mounting openings 423 may be drilled or cast into any existing base portion 420 prior to the assembly of the components. The bottom surface 424 and sidewalls 426 have heat transfer fins 428 provided thereon. The base portion 420 is a heat sink and may be made from aluminum, copper, graphite, metal-filled polymeric compositions, or other such materials with suitably high heat transfer coefficients.

Figure 18:
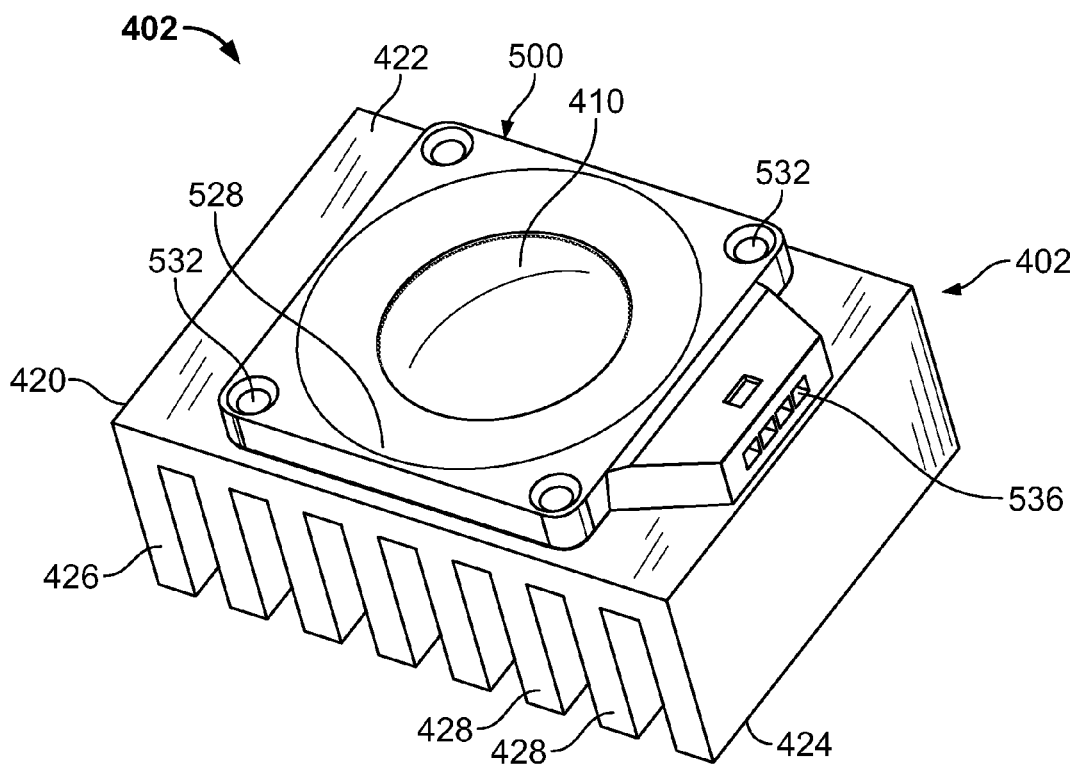
FIG. 18 is a perspective view similar to FIG. 17 with a contact carrier positioned over the LED.
Figure 19:
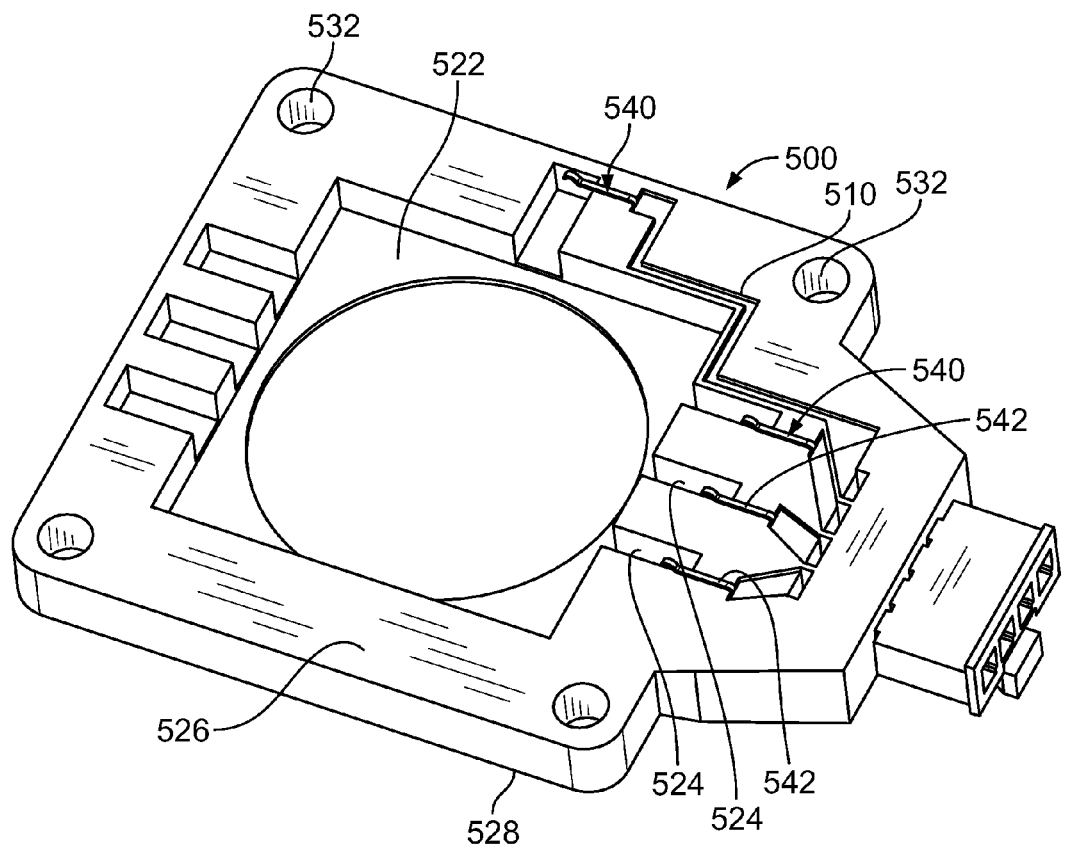
FIG. 19 is a bottom perspective view of the contact carrier, showing contacts positioned therein.

Referring to FIGS. 18 and 19, a contact carrier or cover 500 with circuitry and circuit paths 510 molded therein is provided to cooperate with the LED 410. The cover 500 is a molded interconnect device.

Referring to FIG. 19, cover 500 has an LED seating recess 522 which is dimensioned to seat the LED 410 therein. Contact receiving openings 524 extend from a first surface 526 of the cover 500 toward a second surface 528. As is best shown in FIG. 19, portions of the contact receiving openings 524 extend into the seating recesses 522. Cover mounting openings 532 extend through the cover 500 proximate the corners thereof. Many variations in number and positioning of the cover mounting openings 532 are possible.

Figure 21:
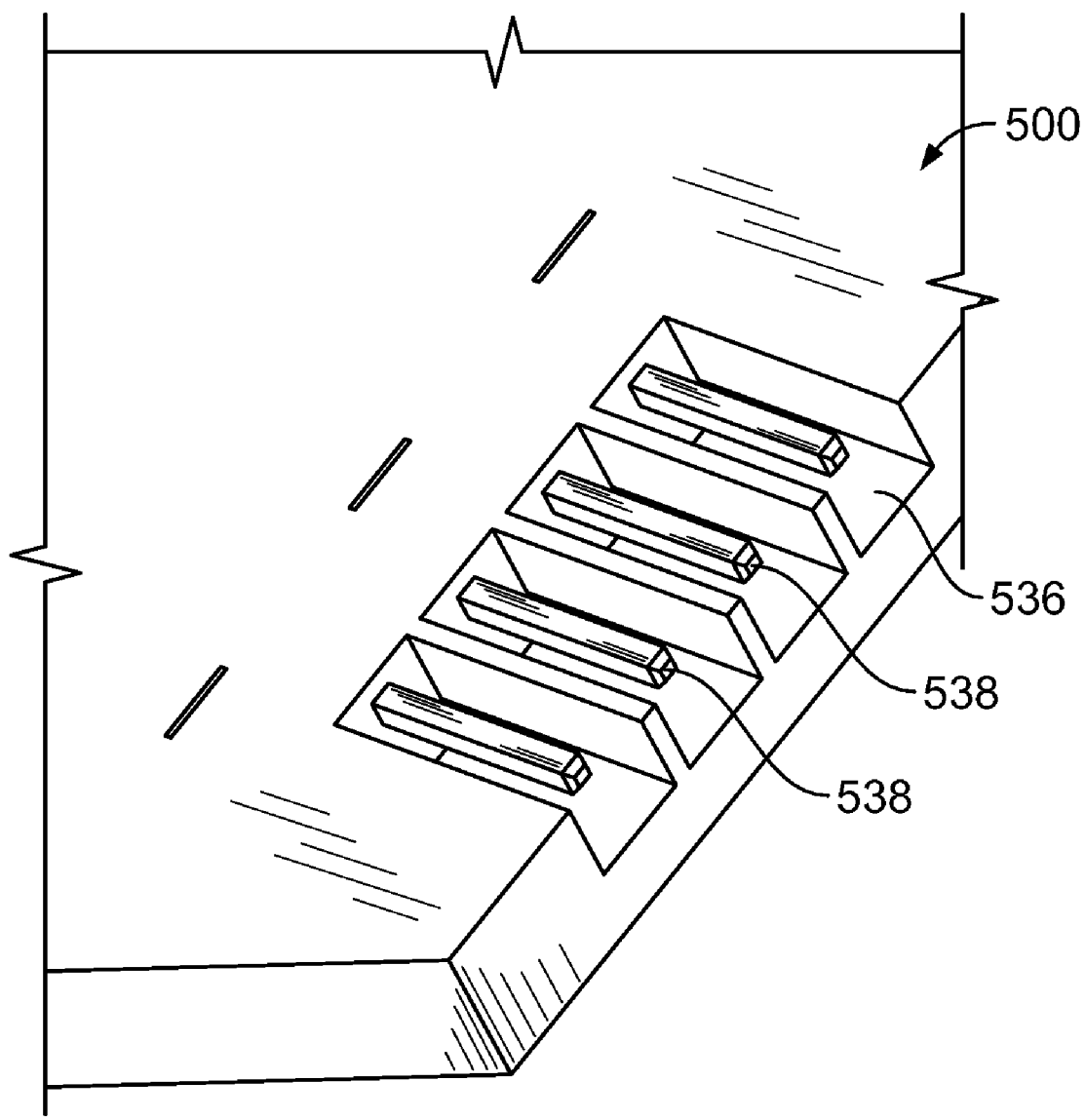
FIG. 21 is an enlarged perspective view of a connector receiving opening on the contact carrier.

Referring to FIGS. 18 and 21, a connector receiving opening or recess 536 is provided on the cover 500. The connector receiving recess 536 can be configured to allow various connectors to be received therein. Contact terminals 538 extend in the connector receiving recess 536. The contact terminals 538 can be plastic pins which have been plated or can be conventional stamped and formed contacts. The contact terminals 538 are provided in electrical contact with the circuit path 510. The connector receiving recess 536 and contact terminals 538 are the interface between the circuitry of the cover 500 and a mating connector (not shown) which delivers the signals to the assembly 402.

Figure 20:
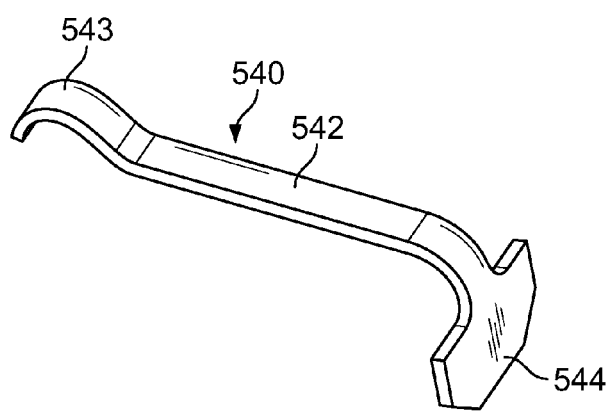
FIG. 20 is a perspective view of a contact prior to insertion into the contact carrier.

As best shown in FIG. 19, contacts 540 are positioned in contact receiving openings 524. As best shown in FIG. 20, contacts 540 have a first section 542 and a second section 544. The first section 542, as shown in FIG. 19, is positioned proximate the first surface 526. Ends 543 of the first sections 542 are curved to allow the ends 543 to make a proper connection with the leads 412 of LEDs 410. The contacts 540 are made from a copper alloy or any material having the appropriate electrical and resilient characteristics required. The second sections 544 extend into the narrow portions of the contact receiving openings 524 and frictionally engage the sides of the narrow portions of the plated contact receiving openings, thereby mounting the contacts 540, both mechanically and electrically, to the cover 500. Consequently, as the cover 500 is brought into engagement with the LED 410, leads 412 of the LED 410 will engage the end 543 of the first sections 542 of the contacts 540. The resiliency of the first sections 542 will allow for the first sections 542 to compensate for minor variations of the leads 412.

During assembly, an electrically insulating and thermally conductive pad 580 is positioned on the top surface 422 of base 420. (FIG. 16) One example of such a pad is the Sil-Pad manufactured by Bergquist. The LED 410 is positioned on the pad 580 (FIG. 17) which electrically isolates the LED 410 from the base 420. The cover 500 is then positioned on the LED 410 and base 420 (FIG. 18). The leads 412 (FIG. 17) of the LED 410 and the contact receiving openings 524 cooperate to provide a keying mechanism to ensure proper positioning of the cover 500. Screws or other types of securing members are then positioned to extend through cover mounting openings 532 and into mounting openings 423 of base 420, thereby securing the components of the assembly 402. A mating connector (not shown) can then be brought into engagement with the connector receiving recess 536.

Due to manufacturing tolerances, it is difficult to precisely control the dimensions of the various molded parts. Therefore, the resiliency of the first sections 542 of the contacts 540 allows an appropriate force to be exerted on the leads 412 of the LEDs 410 even if the various dimensions of the parts vary within tolerances The assemblies described herein allow for the LEDs 10, 410 to be placed in electrical engagement without requiring wire bonding or the use of adhesives. This allows for ease of assembly of the LEDs in the assembly. Repair and/or replacement of the LEDs can easily be done in the field, as the assembly is merely taken apart, the LEDs removed and replaced, and the assembly reassembled. This is feasible due to the resilient nature of the leads, contact and components of the assembly, all of which allow the assembly to be assembled more than once without damaging the components thereof.

The use of the molded interconnect device in place of a more costly printed circuit board reduces the overall cost of the assembly. The molded interconnect contact carrier or substrate also allows for better heat dissipation from the LEDs. As the substrate can be manufactured with appropriate openings, the heat spreader or heat sink can make a good thermal connection with the LEDs to properly draw the heat from the LEDs, thereby extending the life of the LEDs.

As the assemblies have resilient characteristics, the use of the LEDs in extreme or harsh environments is improved. As the assemblies are exposed to various temperatures, the resilient nature of the components allows the components to expand and contract as necessary while still providing sufficient force to maintain the LEDs in electrical engagement.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A light-emitting device assembly, the assembly comprising:
    a contact carrier having a light-emitting device receiving region and resilient contacts provided proximate to the light-emitting device receiving region;
    a light-emitting device, the light-emitting device having leads which extend therefrom, the leads mechanically and electrically engaging the resilient contacts;
    a heat sink thermally coupled to the light-emitting device, the heat sink drawing heat away from the light-emitting device to maintain the light-emitting device at a proper operating temperature;
    a cover extending over the contact carrier and the light-emitting device, the cover having an opening which aligns with the light-emitting device, the opening having a sidewall, at least one portion of the sidewall having resiliency; and
    a securing member integral with the cover, the securing member extending through the contact carrier and into the heat sink to releasably retain the contact carrier and the light-emitting device in position relative to each other and relative to the heat sink;
    whereby as the cover is latched to the heat sink, the at least one portion of the sidewall resiliently cooperates with the light-emitting device to maintain the light-emitting device in position.

2. An assembly as recited in claim 1 wherein the contact carrier is a substrate which is positioned between the light-emitting device and the heat sink, the substrate having a heat sink receiving opening through which a portion of the heat sink extends to thermally engage the light-emitting device.

3. An assembly as recited in claim 2 wherein a thermally conductive material is provided between the portion of the heat sink which extends into the heat sink receiving opening and the light-emitting device, the thermally conductive material facilitating the heat being drawn away from the light-emitting device.

4. An assembly as recited in claim 2 wherein and the securing member being a plurality of latching legs which cooperate with openings in the heat sink to resiliently latch to the cover to the heat sink, causing the light-emitting device and the resilient contacts to be maintained in electrical engagement and the light-emitting device and the heat sink to be maintained in thermal engagement.

5. An assembly as recited in claim 4 wherein the opening of the cover having slits provided in the sidewalls thereof; the slits separate the at least one portions of the sidewalls whereby.

6. An assembly as recited in claim 1 wherein the contact carrier is a molded interconnect device.

7. An assembly as recited in claim 6 wherein a mating connector receiving recess is integrally molded in the contact carrier, the mating connector receiving recess being configured to receive a mating connector therein.

8. An assembly as recited in claim 1 wherein the light-emitting device is a light-emitting diode.

9. A light-emitting diode assembly, the assembly comprising:
    a contact carrier having a light-emitting diode receiving region and resilient contacts provided proximate to the light-emitting diode receiving region, the light-emitting diode receiving region having a heat sink engagement area;
    a light-emitting diode, the light-emitting diode having leads which extend therefrom, the leads mechanically and electrically engaging the resilient contacts;
    a heat sink extending into the heat sink engagement area and thermally coupled to the light-emitting diode, the heat sink drawing heat away from the light-emitting diode to maintain the light-emitting diode at a proper operating temperature;
    a cover extending over the contact carrier and the light-emitting diode, the cover having an opening which aligns with the light-emitting diode, the opening having a sidewall, the sidewall having at least one section having resiliency; and
    a securing member, the securing member extending through the contact carrier and into the heat sink to releasably retain the contact carrier and the light-emitting diode in position relative to each other and relative to the heat sink;
    whereby as the cover is latched to the heat sink, the at least one section of the sidewall resiliently cooperates with the light-emitting diode to maintain the light-emitting diode in position.

10. An assembly as recited in claim 9 wherein the contact carrier is a substrate which is positioned between the light-emitting diode and the heat sink.

11. An assembly as recited in claim 10 wherein a thermally conductive material is provided between the portion of the heat sink which extends in the heat sink receiving opening and the light-emitting diode, the thermally conductive material facilitating the heat being drawn away from the light-emitting diode.

12. An assembly as recited in claim 10 wherein the securing member being a plurality of latching legs which cooperate with openings in the heat sink to resiliently latch to the cover to the heat sink, causing the light-emitting diode and the resilient contacts to be maintained in electrical engagement and the light-emitting diode and the heat sink to be maintained in thermal engagement.

13. An assembly as recited in claim 12 wherein the opening of the cover having slits provided in the sidewalls thereof; the slits separate the at least one section of the sidewall.

14. An assembly as recited in claim 9 wherein the contact carrier is the cover having mounting openings through which the securing member extends.

15. A light-emitting diode assembly, the assembly comprising:
    a molded interconnect device having a light-emitting diode receiving region and resilient contacts provided proximate to the light-emitting diode receiving region, the light-emitting diode receiving region having a heat sink engagement area;
    a light-emitting diode, the light-emitting diode having leads which extend therefrom, the leads mechanically and electrically engaging the resilient contacts;
    a heat sink extending into the heat sink engagement area and thermally coupled to the light-emitting diode;
    a cover extending over the molded interconnect device and the light-emitting diode, the cover having an opening which aligns with the light-emitting diode, the opening having a resilient sidewall; and
    a securing member, the securing member extending through the molded interconnect device and into the heat sink to releasably retain the molded interconnect device and the light-emitting diode in position relative to each other and relative to the heat sink;
    whereby as the cover is latched to the heat sink, the sidewall resiliently cooperates with the light-emitting diode to maintain the light-emitting diode in position.

16. An assembly as recited in claim 15 wherein the molded interconnect device is a substrate which is positioned between the light-emitting diode and the heat sink.

17. An assembly as recited in claim 16 wherein the securing member being a plurality of latching legs which cooperate with openings in the heat sink to resiliently latch to the cover to the heat sink, causing the light-emitting diode and the resilient contacts to be maintained in electrical engagement and the light-emitting diode and the heat sink to be maintained in thermal engagement.

18. An assembly as recited in claim 17 wherein the opening of the cover having slits provided in the sidewalls thereof; the slits separate portions of the sidewall, allowing the portions of the sidewalls to have independent resiliency, whereby as the cover is latched to the heat sink, the portions of the sidewalls resiliently cooperate with the light-emitting diode to maintain the light-emitting device diode in position.

19. An assembly as recited in claim 15 wherein the cover having mounting openings through which the securing members extend.

* * * * *